(12) United States Patent
Pan et al.

(10) Patent No.: US 9,449,136 B2
(45) Date of Patent: Sep. 20, 2016

(54) INTEGRATED CIRCUIT LAYOUT STRUCTURE AND METHOD HAVING DIFFERENT CELL ROW HEIGHTS WITH DIFFERENT ROW RATIOS FOR AREA OPTIMIZATION

(71) Applicants: Yu-Hsiang Pan, Taipei (TW); Pang-Chun Liu, New Taipei (TW)

(72) Inventors: Yu-Hsiang Pan, Taipei (TW); Pang-Chun Liu, New Taipei (TW)

( * ) Notice: Subject to any disclaimer, the term of this patent is extended or adjusted under 35 U.S.C. 154(b) by 9 days.

(21) Appl. No.: 14/601,187

(22) Filed: Jan. 20, 2015

(65) Prior Publication Data
US 2016/0210390 A1    Jul. 21, 2016

(51) Int. Cl.
*G06F 17/50* (2006.01)

(52) U.S. Cl.
CPC ....... *G06F 17/5072* (2013.01); *G06F 17/5068* (2013.01)

(58) Field of Classification Search
CPC .................. G06F 17/5072; G06F 17/5068
USPC ........... 716/118–119, 122, 132, 135; 326/41, 326/47
See application file for complete search history.

(56) References Cited

U.S. PATENT DOCUMENTS

| | | | |
|---|---|---|---|
| 2004/0010765 A1* | 1/2004 | Jiang | H01L 27/0207 716/123 |
| 2005/0198604 A1* | 9/2005 | Yoshida | G06F 17/5072 716/119 |
| 2009/0033368 A1* | 2/2009 | Pitts | G06F 17/5068 326/101 |
| 2009/0271753 A1* | 10/2009 | Quandt | G06F 17/5068 716/119 |
| 2010/0050140 A1* | 2/2010 | Chang | G06F 17/5081 716/113 |
| 2010/0162184 A1* | 6/2010 | Penzes | G06F 17/505 716/120 |
| 2010/0289111 A1* | 11/2010 | Lee | G06F 17/5072 257/499 |
| 2012/0110534 A1* | 5/2012 | Li | G06F 17/5072 716/120 |
| 2012/0286331 A1* | 11/2012 | Aton | H01L 27/0207 257/202 |
| 2012/0286858 A1* | 11/2012 | Biggs | H01L 27/0207 327/565 |
| 2013/0042216 A1* | 2/2013 | Loh | G06F 17/5068 716/119 |
| 2013/0093027 A1* | 4/2013 | Kato | H01L 27/088 257/401 |
| 2013/0125077 A1* | 5/2013 | Rozen | G06F 17/505 716/119 |
| 2013/0214433 A1* | 8/2013 | Penzes | H01L 27/0207 257/786 |
| 2014/0035152 A1* | 2/2014 | Quandt | G06F 17/5068 257/773 |
| 2014/0183646 A1* | 7/2014 | Hatamian | G06F 17/5081 257/369 |
| 2014/0325466 A1* | 10/2014 | Ke | G06F 17/5072 716/119 |
| 2015/0143321 A1* | 5/2015 | Quandt | G06F 17/5068 716/121 |
| 2015/0213183 A1* | 7/2015 | Lee | G06F 17/5072 716/119 |

* cited by examiner

*Primary Examiner* — Stacy Whitmore
(74) *Attorney, Agent, or Firm* — Winston Hsu; Scott Margo

(57) ABSTRACT

An integrated circuit layout structure and method thereof establishes cell rows with different cell heights for accommodating cells with corresponding heights, such that an area of an integrated circuit can be fully utilized. Therefore, it reduces an area wasted by an unnecessary uniform cell height, so as to improve integration of the integrated circuit.

2 Claims, 10 Drawing Sheets

FIG. 5A

| H_ROW |
|---|
| L_ROW |
| H_ROW |
| H_ROW |
| L_ROW |
| H_ROW |
| H_ROW |
| L_ROW |
| H_ROW |
| H_ROW |
| L_ROW |
| H_ROW |

FIG. 5B

| L_ROW |
|---|
| H_ROW |
| L_ROW |
| H_ROW |
| L_ROW |
| H_ROW |
| L_ROW |
| H_ROW |
| L_ROW |
| H_ROW |

FIG. 5C

| L_ROW |
|---|
| H_ROW |
| L_ROW |
| H_ROW |
| L_ROW |
| L_ROW |
| H_ROW |
| L_ROW |
| H_ROW |
| L_ROW |
| L_ROW |
| H_ROW |
| L_ROW |
| H_ROW |
| L_ROW |

FIG. 5D

| L_ROW |
|---|
| H_ROW |
| L_ROW |
| L_ROW |
| H_ROW |
| L_ROW |
| L_ROW |
| H_ROW |
| L_ROW |

INTEGRATED CIRCUIT LAYOUT STRUCTURE AND METHOD HAVING DIFFERENT CELL ROW HEIGHTS WITH DIFFERENT ROW RATIOS FOR AREA OPTIMIZATION

BACKGROUND OF THE INVENTION

1. Field of the Invention

The present invention relates to an integrated circuit layout structure and method thereof, and more specifically, to an integrated circuit layout structure utilizing auto place and route (APR) layout for reducing an occupied area and improving integration of an integrated circuit and a method thereof.

2. Description of the Prior Art

Standard cells with an identical cell height are used in the conventional auto place and route (APR) layout for an integrated circuit. Each of the standard cells has different functions, but they have the same height. As a result, the standard cells can be integrated for performing different electrical operations. Furthermore, since each of the standard cells has the same height, the standard cells have no difference in height and can be connected as bricks by APR tools, so as to connect a power end and a ground end of each of the standard cells to one another.

Please refer to FIG. 1A, FIG. 1B, and FIG. 1C. FIG. 1A is a diagram of a cell DF 1 and an INV1 3 in the prior art. FIG. 1B is a layout diagram of the cell DF 1 and the INV1 3 in the prior art. FIG. 1C is a layout diagram of a metal layer of the cell DF 1 and the INV1 3 in the prior art. As shown in FIG. 1A to FIG. 1C, the cell DF 1 and the cell INV1 3 have an identical cell height L. Thus, a power end 50 and a ground end 60 of the cell DF 1 are connected to the power end 50 and the ground end 60 of the cell INV1 3 for power transmission when the cell DF 1 and the cell INV1 3 are placed adjacent to each other during layout, respectively.

Please see FIG. 2A, FIG. 2B, and FIG. 2C. FIG. 2A is a diagram of a conventional integrated circuit in the prior art. FIG. 2B is a layout diagram of the conventional integrated circuit in the prior art. FIG. 2C is a metal layer layout diagram of the conventional integrated circuit in the prior art. As shown in FIG. 2A, FIG. 2B and FIG. 2C, the conventional integrated circuit includes the cell DF 1, the cell INV1 3, a cell XOR1 5, a cell NR2 7, a cell AND_3 9, a cell INV2 11, a cell DLYL3 13, and a cell 023ND 15. The cell DF 1, the cell INV1 3, the cell XOR1 5, the cell AND_3 9, the cell INV2 11, the cell DLYL3 13, and the cell 023ND 15 are with the same height L. The cell DF 1, the cell INV1 3, the cell XOR1 5, and the cell NR2 7 are arranged in a first cell row and adjacent by turns. The cell AND_3 9, the cell INV2 11, the cell DLYL3 13, and the cell 023ND 15 are arranged in a second cell row and adjacent in turns. Power ends 50 are disposed on an upper side of the cell DF 1, the cell INV1 3, the cell XOR1 5, and the cell NR2 7 which are located in the first cell row and on a lower side of the cell AND_3 9, the cell INV2 11, the cell DLYL3 13, and the cell 023ND 15 which are located in the second cell row. Ground ends 60 are disposed on a lower side of the cell DF 1, the cell INV1 3, the cell XOR1 5, and the cell NR2 7 which are located in the first cell row and on an upper side of the cell AND_3 9, the cell INV2 11, the cell DLYL3 13, and the cell 023ND 15 which are located in the second cell row, i.e., the ground ends 60 are disposed between the first cell row and the second cell row.

Since cells are required to be connected as bricks according to a method of the conventional integrated circuit layout structure, the cells should have an identical height. Otherwise, power ends or ground ends of the cells cannot transmit power due to discontinuous connection therebetween. Please see FIG. 3A, FIG. 3B, and FIG. 3C. FIG. 3A is a diagram of the cell DF 1 and a cell INV1 2 in the prior art. FIG. 3B is a layout diagram of the cell DF 1 and the cell INV1 2 in the prior art. FIG. 3C is a metal layer layout diagram of the cell DF 1 and the cell INV1 2 in the prior art. As shown in FIG. 3A, FIG. 3B, and FIG. 3C, a cell height L1 of the cell DF 1 is different from a cell height L2 of the cell INV1 2. When the cell DF 1 and the cell INV1 2 are placed in a same row and the ground end 60 of the cell DF 1 is able to be connected to a ground end 60' of the cell INV1 2, the power end 50 of the cell DF 1 is not able to be connected to a power end 50' of the cell DF 1 for transmitting power due to a difference in height.

When a cell height of a standard cell integrated by APR layout is required, a cell height of the standard cell is decided by a cell height of the most complicated cell in a whole library in the APR layout system. However, it leads to an increase of an area of the whole integrated circuit and results in waste for a simple cell which is required a small area.

SUMMARY OF THE INVENTION

The present invention aims at providing an integrated circuit layout structure and a method thereof capable of fully utilizing an area of an integrated circuit and reducing unnecessary waste of the area of the integrated circuit, for solving above drawbacks.

According to the claimed invention, an integrated circuit layout structure includes a first cell row and a second cell row. The first cell row has a first cell height. The second cell row has a second cell height. The first cell row and the second cell row are adjacent to each other and arranged indifferent rows in an integrated circuit.

According to the claimed invention, the first cell row includes a first cell with the first cell height, and the second cell row includes a second cell with the second cell height.

According to the claimed invention, a row ratio of a row number of the first cell row to a row number of the second cell row is determined by an area ratio of an area of the first cell with the first cell height to an area of the second cell with the second cell height in the integrated circuit.

According to the claimed invention, an integrated circuit layout structure includes a first cell row, a second cell row, and a third cell row. The first cell row has a first cell height. The second cell row has a second cell height. The third cell row has a third cell height. The first cell row is adjacent to the second cell row, and the second cell row is adjacent to the third cell row. The first cell row, the second cell row, and the third cell row are arranged in different rows in an integrated circuit.

According to the claimed invention, the first cell row includes a first cell with the first cell height, the second cell row includes a second cell with the second cell height, and the third cell row includes a third cell with the third cell height.

According to the claimed invention, a row ratio of a row number of the first cell row to a row number of the second cell row to a row number of the third cell row is determined by an area ratio of an area of the first cell with the first cell height to an area of the second cell with the second cell height to an area of the third cell with the third cell height in the integrated circuit.

According to the claimed invention, a method for integrating an integrated circuit layout structure includes: inputting a circuit diagram file, wherein the circuit diagram file includes a plurality of cells, the plurality of cells is categorized into N categories by cell height thereof; calculating an area of the cells for each of the N categories; determining a row ratio for each of the N categories based on an area ratio of each area of the cells; and establishing N cell rows according to the row ratio, wherein N is an integer greater than or equal to 2.

According to the claimed invention, the area of the cells for each of the N categories is calculated manually or by a program.

According to the claimed invention, the circuit diagram file is in a Verilog or an EDIF format.

In summary, the present invention provides the integrated circuit layout structure and the method thereof capable of fully utilizing an area of the integrated circuit and reducing unnecessary waste of the area of the integrated circuit, so as to improve integration of the integrated circuit. Compared to the prior art, the integrated circuit layout structure and the method of the present invention save an area rate of 16% to 25% of the integrated circuit.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 5A is a diagram of the integrated circuit layout structure illustrating that a row ratio of an H_ROW to an L_ROW is 2:1 according to the embodiment of the present invention.

FIG. 5B is a diagram of the integrated circuit layout structure illustrating that a row ratio of the H_ROW to the L_ROW is 1:1 according to the embodiment of the present invention.

FIG. 5C is a diagram of the integrated circuit layout structure illustrating that a row ratio of an H_ROW to an L_ROW is 2:3 according to the embodiment of the present invention.

FIG. 5D is a diagram of the integrated circuit layout structure illustrating that a row ratio of an H_ROW to an L_ROW is 1:2 according to the embodiment of the present invention.

DETAILED DESCRIPTION

Figure 1A:
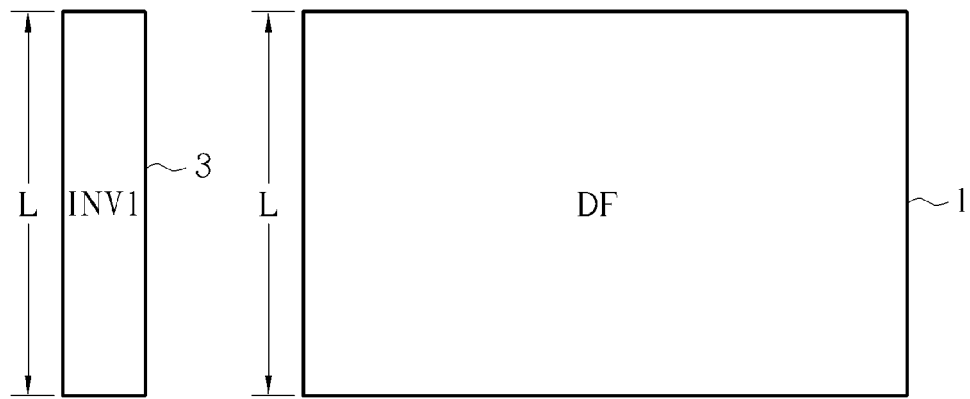
FIG. 1A is a diagram of a cell DF 1 and an INV1 3 in the prior art.
Figure 1B:
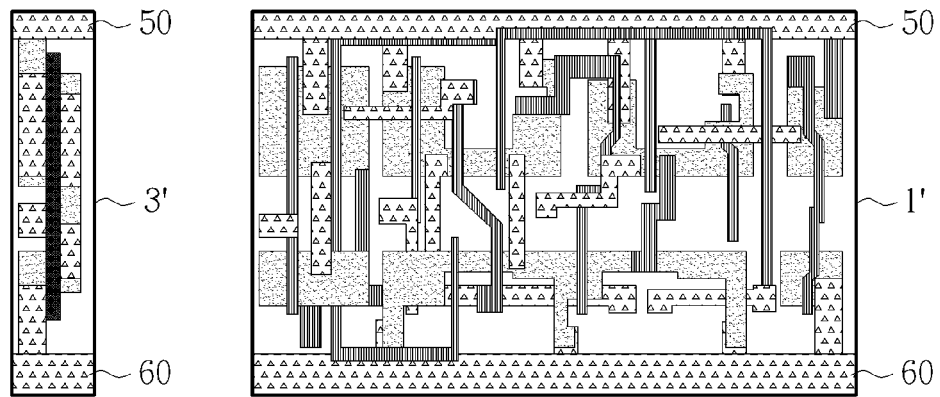
FIG. 1B is a layout diagram of the cell DF 1 and the INV1 3 in the prior art.
Figure 1C:
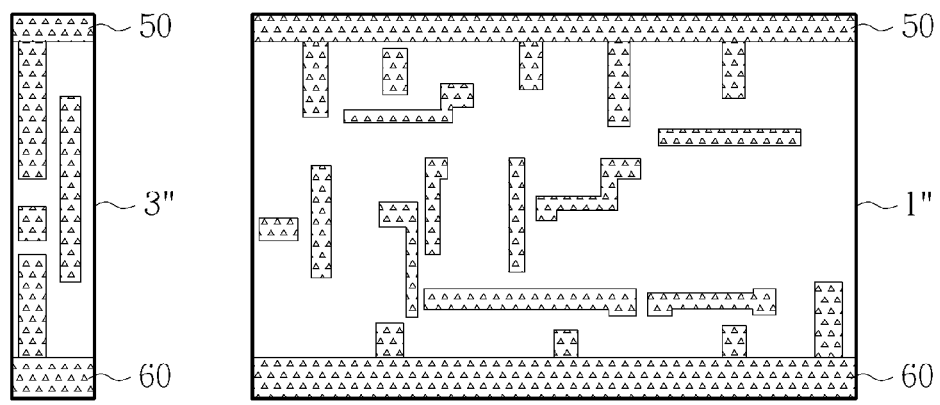
FIG. 1C is a layout diagram of a metal layer of the cell DF 1 and the INV1 3 in the prior art.
Figure 2A:
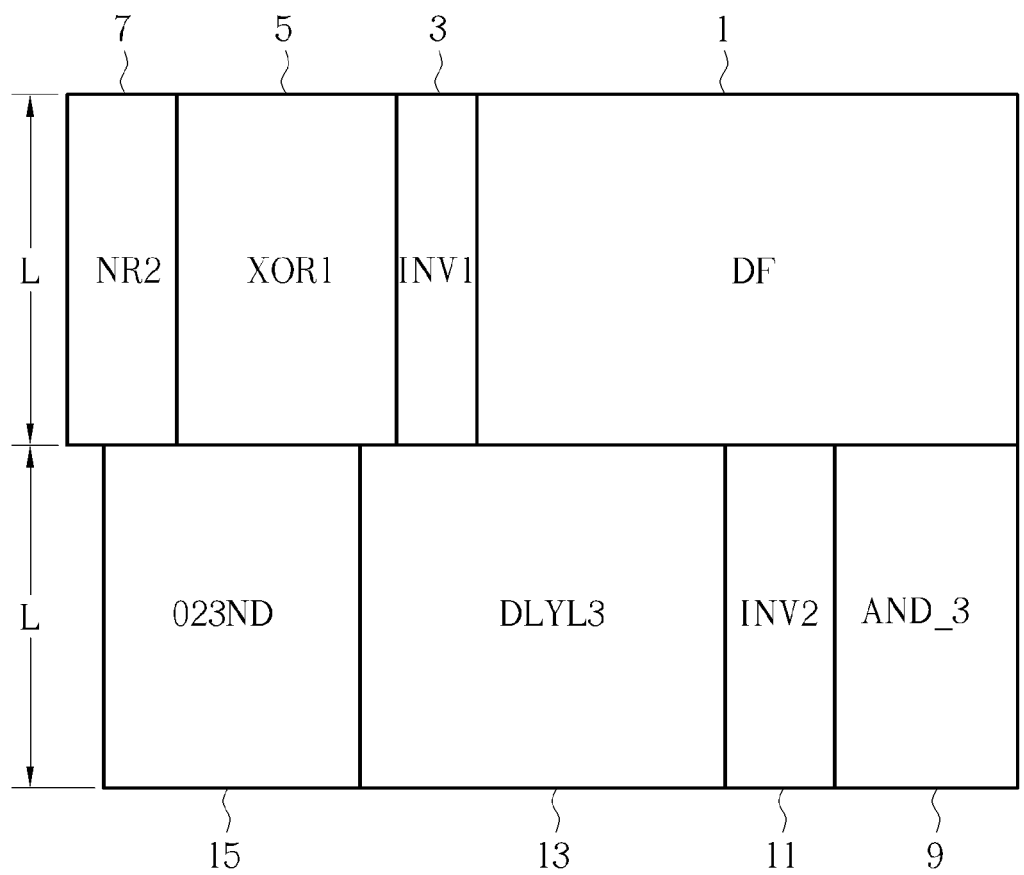
FIG. 2A is a diagram of a conventional integrated circuit in the prior art.
Figure 2B:
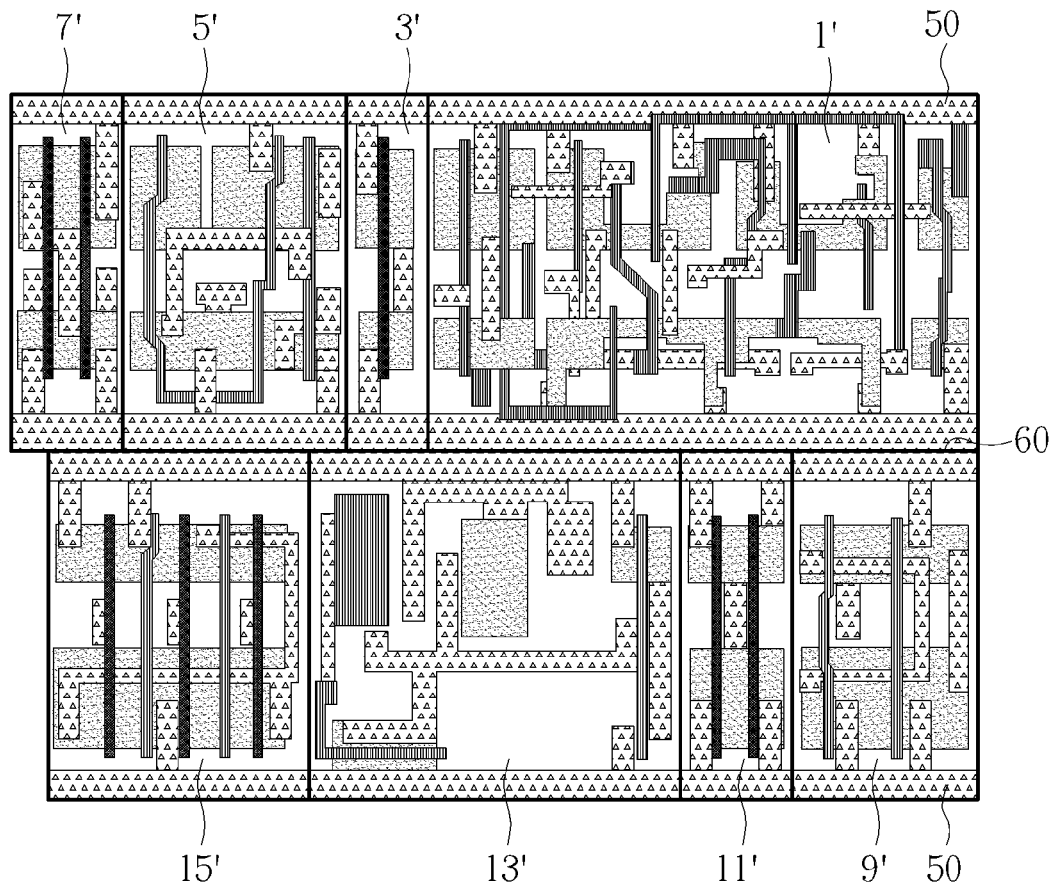
FIG. 2B is a layout diagram of the conventional integrated circuit in the prior art.
Figure 2C:
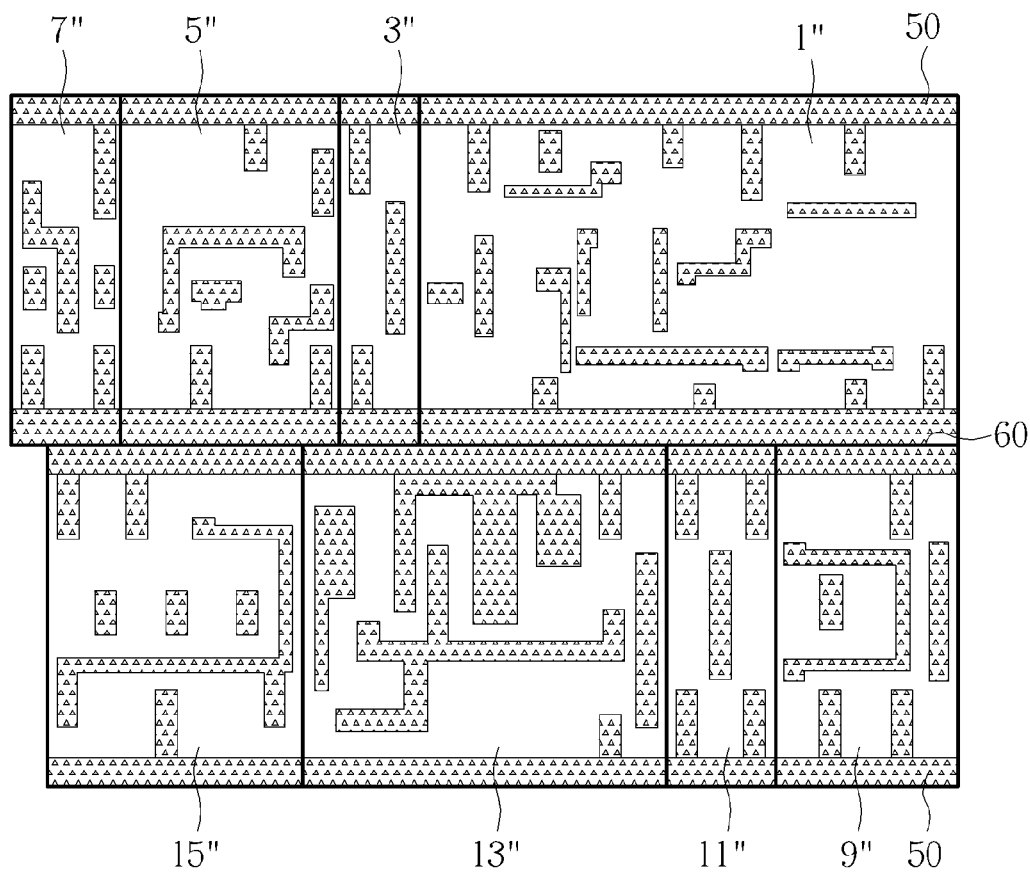
FIG. 2C is a metal layer layout diagram of the conventional integrated circuit in the prior art.
Figure 3A:
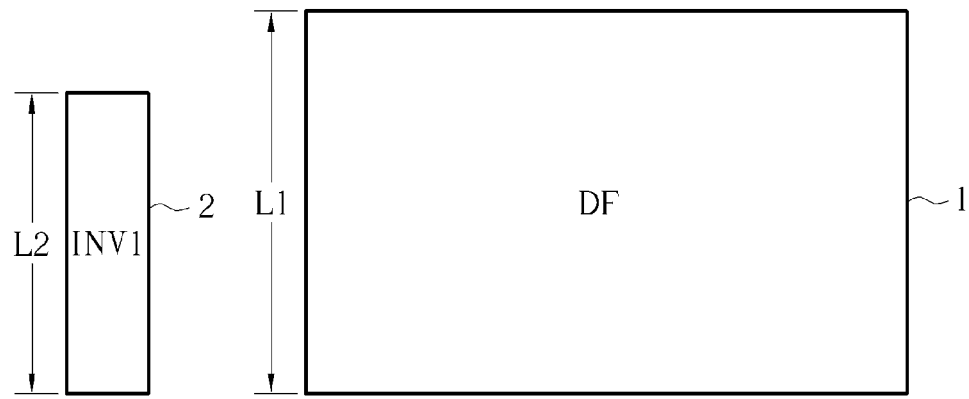
FIG. 3A is a diagram of the cell DF 1 and a cell INV1 2 in the prior art.
Figure 3B:
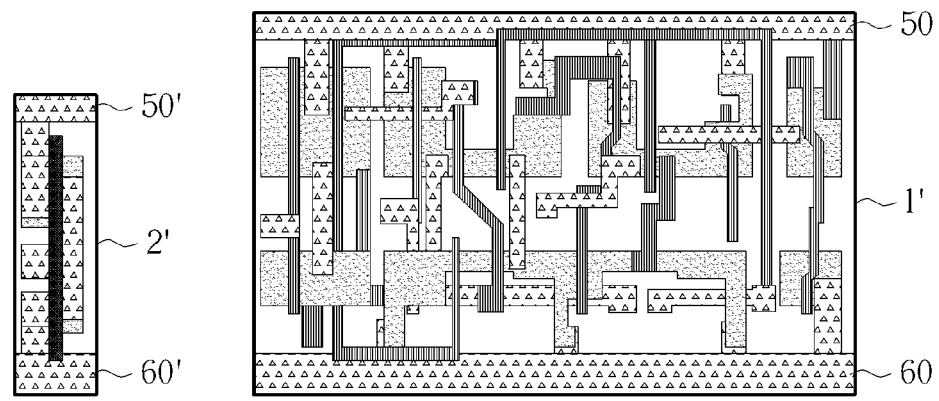
FIG. 3B is a layout diagram of the cell DF 1 and the cell INV1 2 in the prior art.
Figure 3C:
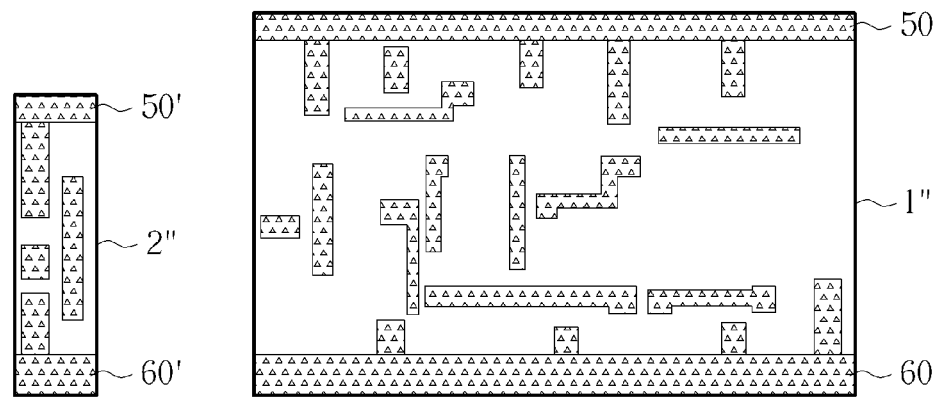
FIG. 3C is a metal layer layout diagram of the cell DF 1 and the cell INV1 2 in the prior art.
Figure 4A:
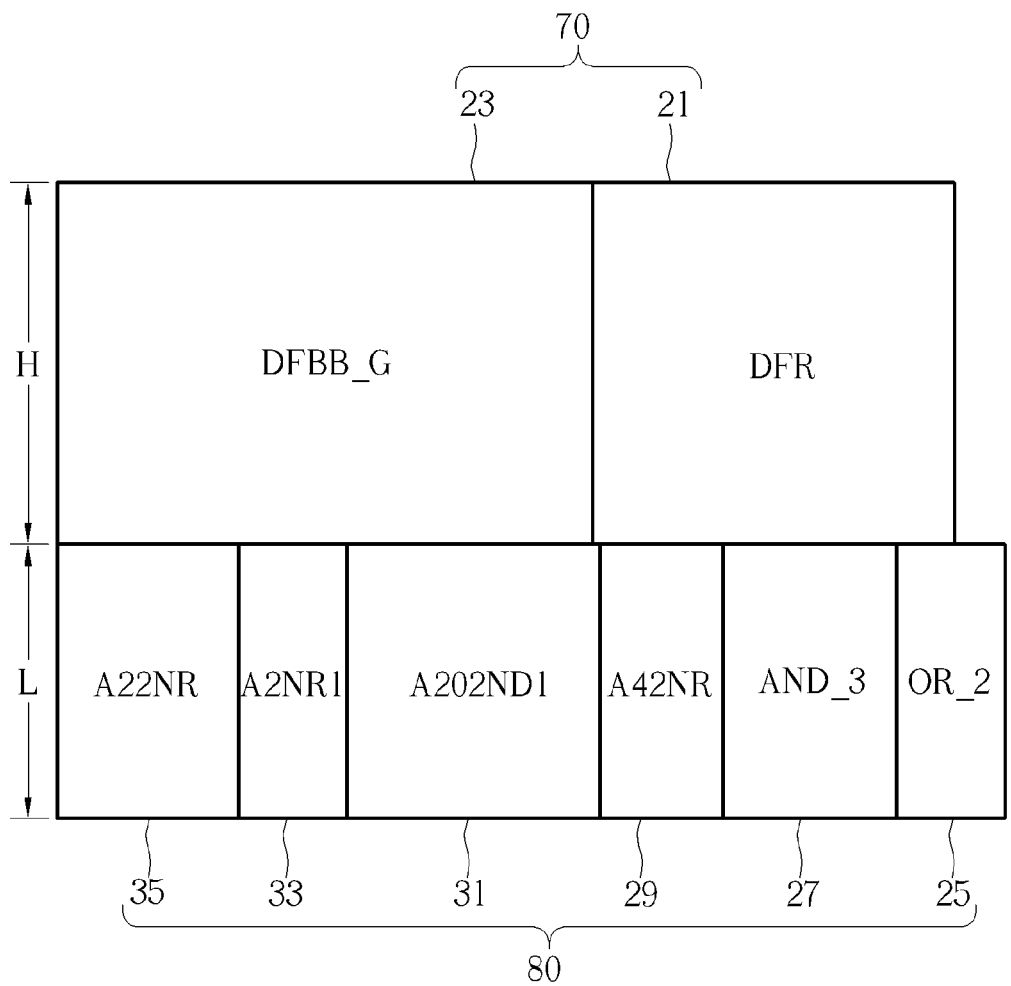
FIG. 4A is a diagram of an integrated circuit layout structure according to an embodiment of the present invention.

Please refer to FIG. 4A. FIG. 4A is a diagram of an integrated circuit layout structure according to an embodiment of the present invention. The integrated circuit layout structure includes a first cell row 70 (hereinafter H_ROW 70) having a cell height H (exemplified 13.3 μm) and a second cell row 80 (hereinafter L_ROW 80) having a cell height L (exemplified 9.8 μm). The H_ROW 70 includes a cell DFR 21 and the cell DFBB_G 23 connected to the cell DFR 21, wherein both of the cell DFR 21 and the cell DFBB_G 23 have the cell height H. The L_ROW includes a cell OR_2 25, a cell AND_3 27, a cell A42NR 29, a cell A202ND1, a cell A2NR1 33, and a cell A22NR 35, and the cell OR_2 25, the cell AND_3 27, the cell A42NR 29, the cell A202ND1, the cell A2NR1 33 and the cell A22NR 35 are connected in turns and have the cell height L. The H_ROW 70 with the cell height H and the L_ROW 80 with the cell height L are arranged in different rows. Power ends 50 are disposed at an upper side of the H_ROW 70 and at a lower side of the L_ROW 80, respectively. A ground end 60 is disposed at a lower side of the H_ROW 70 and at an upper side of the L_ROW 80, i.e., the ground end 60 is disposed between the H_ROW 70 and the L_ROW 80.

Figure 4B:
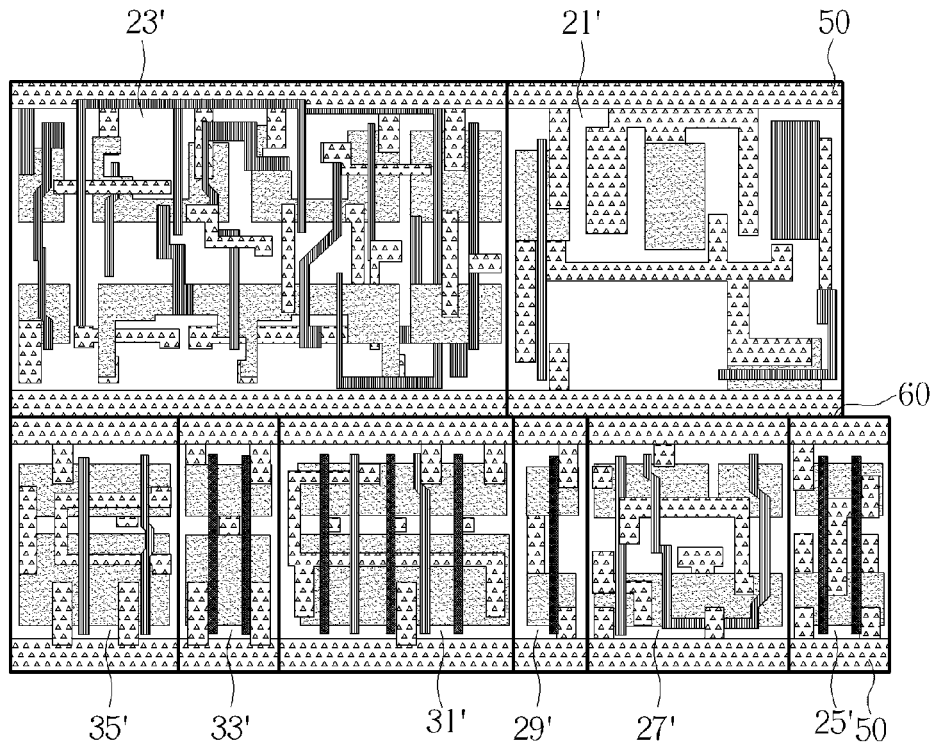
FIG. 4B is a layout diagram of the integrated circuit layout structure according to the embodiment of the present invention.
Figure 4C:
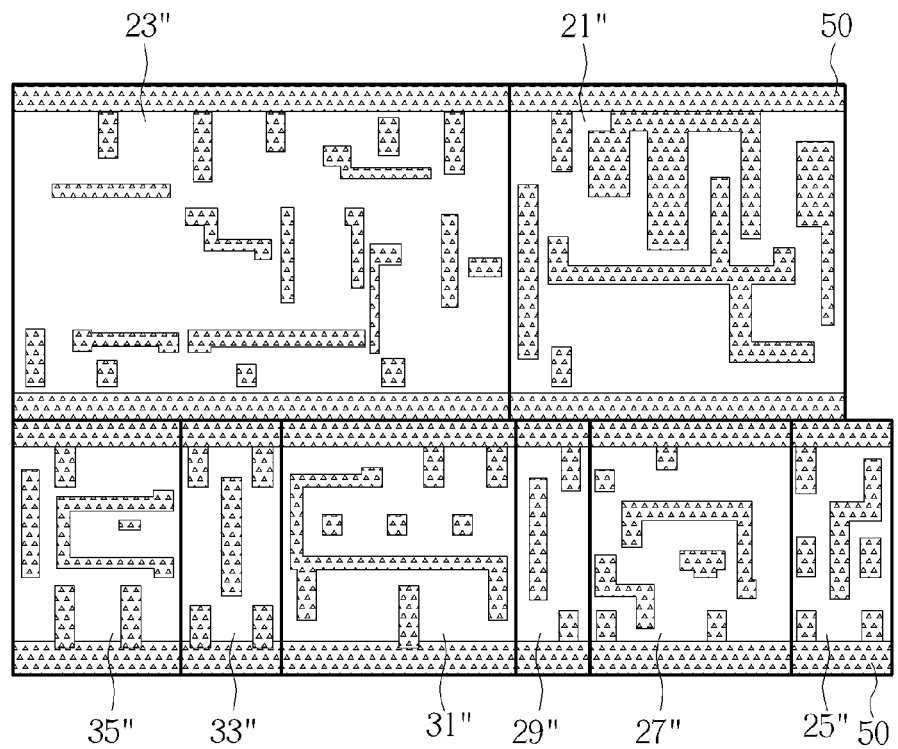
FIG. 4C is a metal layer layout diagram of the integrated circuit layout structure according to the embodiment of the present invention.

Please refer to FIG. 4A to FIG. 4C. FIG. 4B is a layout diagram of the integral circuit layout structure according to the embodiment of the present invention. FIG. 4C is a metal layer layout diagram of the integrated circuit layout structure according to the embodiment of the present invention. As shown in FIG. 4A to FIG. 4C, the integrated circuit structure of the present invention can be adapted to the cells with different heights, but it is not limited to thereto. The cells are categorized by cell heights thereof and placed into corresponding cell rows, so as to reduce an area of the integrated circuit . Therefore, the integrated circuit layout structure of the present invention compresses the area of the integrated circuit. Furthermore, the cells placed in the same cell row have an identical cell height, such that the power end 50 of each of the cells can be aligned and connected to one another for power transmission, namely, the ground end 60 of each of the cells can be aligned and connected to one another for grounding.

Please refer to FIG. 5A to FIG. 5D. FIG. 5A is a diagram of the integrated circuit layout structure illustrating that a row ratio of the H_ROW to the L_ROW is 2:1 according to the embodiment of the present invention. FIG. 5B is a diagram of the integrated circuit layout structure illustrating that a row ratio of the H_ROW to the L_ROW is 1:1 according to the embodiment of the present invention. FIG. 5C is a diagram of the integrated circuit layout structure illustrating that a row ratio of the H_ROW to the L_ROW is 2:3 according to the embodiment of the present invention. FIG. 5D is a diagram of the integrated circuit layout structure illustrating that a row ratio of the H_ROW to the L_ROW is 1:2 according to the embodiment of the present invention. As shown in FIG. 5A to FIG. 5D, a row ratio of a row number of each of the cell rows is determined by an area ratio of area of each of the cell rows. As shown in FIG. 5A, the row ratio of the H_ROW to the L_ROW is 2:1. As shown in FIG. 5B, the row ratio of the H_ROW to the L_ROW is 1:1. As shown in FIG. 5C, the row ratio of the H_ROW to the L_ROW is 2:3. As shown in FIG. 5D, the row ratio of the H_ROW to the L_ROW is 1:2. Furthermore, as shown in FIG. 5A to FIG. 5D, the cell rows are arranged based on the row ratio repeatedly and periodically.

Figure 6A:
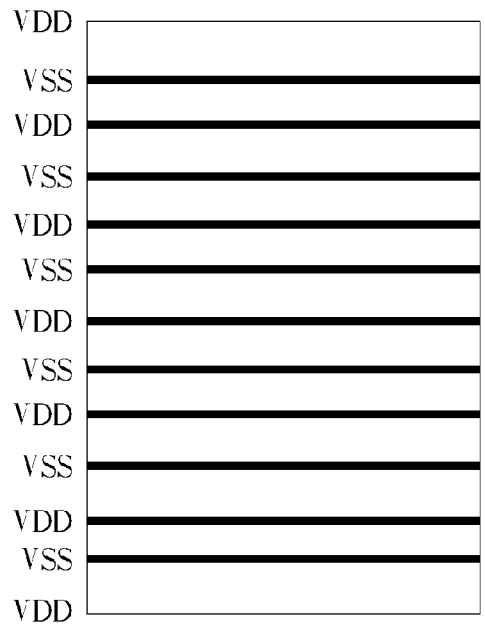
FIG. 6A is a diagram of the integrated circuit layout structure corresponding to in FIG. 5A and showing VDDs for power supply and VSSs for grounding according to the embodiment of the present invention.
Figure 6B:
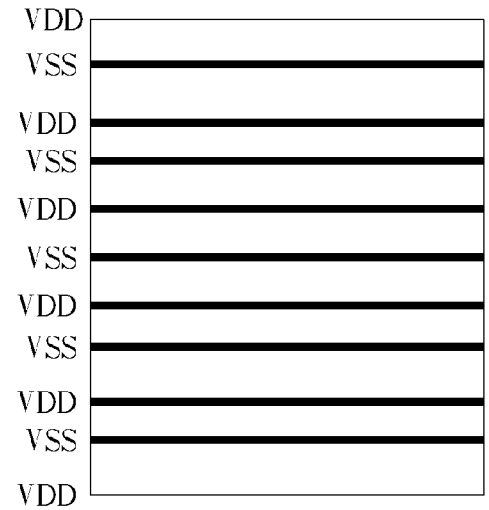
FIG. 6B is a diagram of the integrated circuit layout structure corresponding to in FIG. 5B and showing VDDs for power supply and VSSs for grounding according to the embodiment of the present invention.
Figure 6C:
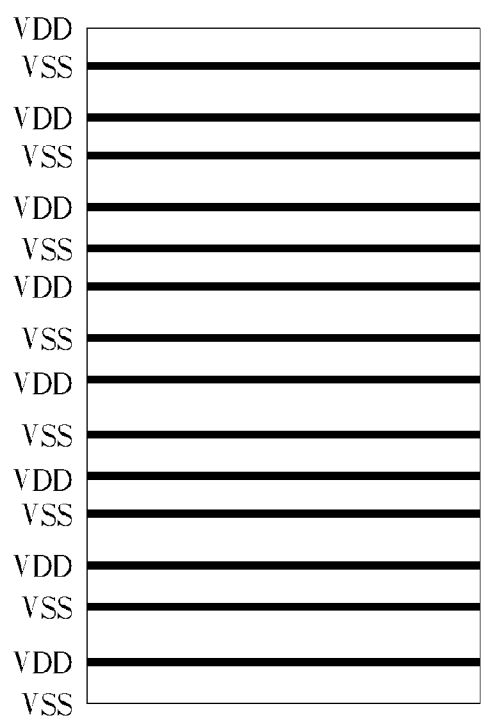
FIG. 6C is a diagram of the integrated circuit layout structure corresponding to in FIG. 5C and showing VDDs for power supply and VSSs for grounding according to the embodiment of the present invention.
Figure 6D:
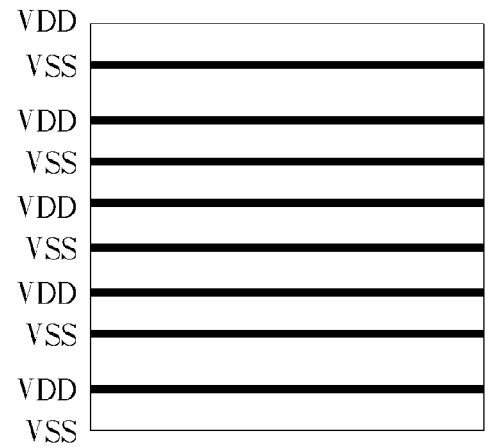
FIG. 6D is a diagram of the integrated circuit layout structure corresponding to in FIG. 5D and showing VDDs for power supply and VSSs for grounding according to the embodiment of the present invention.

Please refer to FIG. 6A to FIG. 6D. FIG. 6A is a diagram of the integrated circuit layout structure corresponding to FIG. 5A and showing VDDs for power supply and VSSs for grounding according to the embodiment of the present invention. FIG. 6B is a diagram of the integrated circuit layout structure corresponding to FIG. 5B and showing VDDs for power supply and VSSs for grounding according to the embodiment of the present invention. FIG. 6C is a diagram of the integrated circuit layout structure corresponding to FIG. 5C and showing VDDs for power supply and VSSs for grounding according to the embodiment of the present invention. FIG. 6D is a diagram of the integrated circuit layout structure corresponding to FIG. 5D and showing VDDs for power supply and VSSs for grounding according to the embodiment of the present invention. As shown in FIG. 6A to FIG. 6D. FIG, the power end 50 of each the cells in the same cell row are electrically connected for power supply and the ground end 60 of each of the cells in the same cell are electrically connected for grounding.

Figure 7:
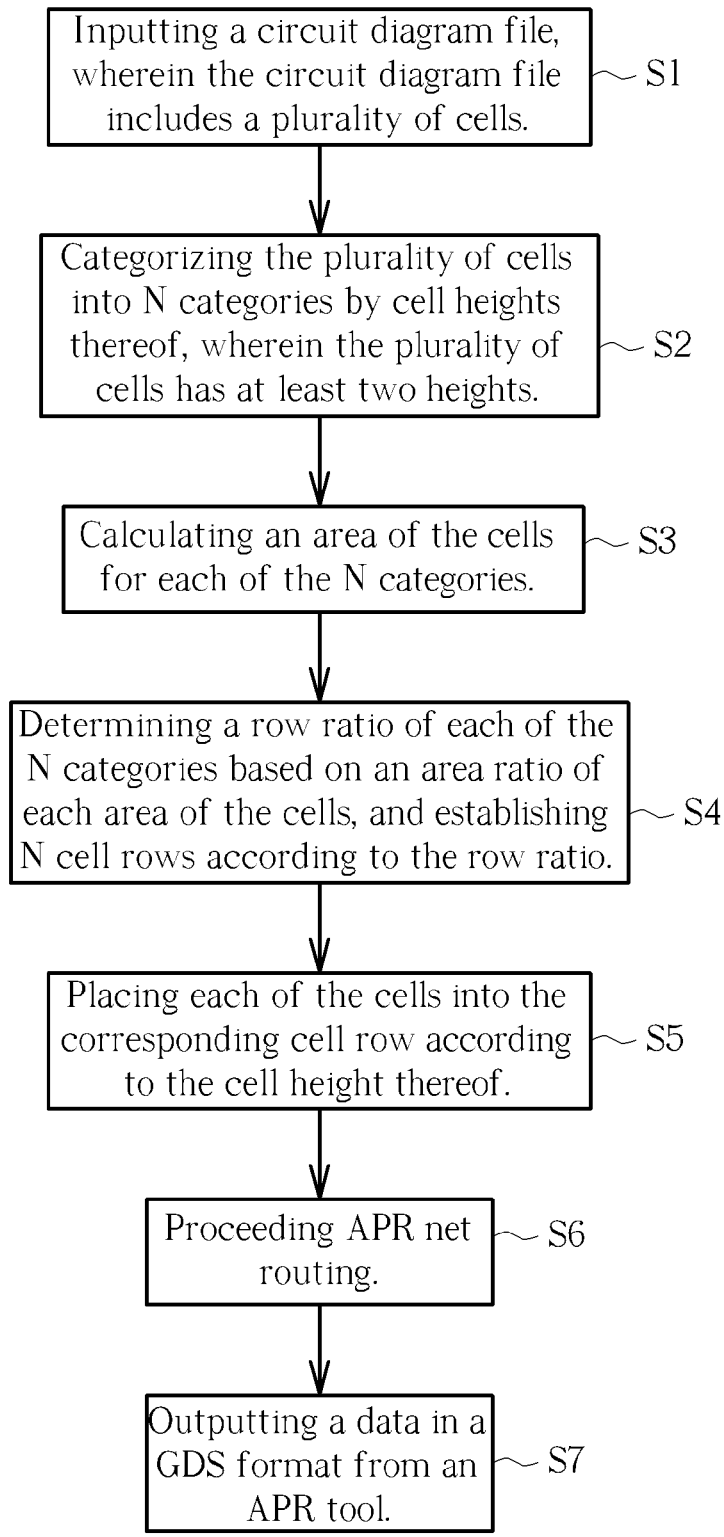
FIG. 7 is a flow chart of a method for integrating the integrated circuit layout structure according to the embodiment of the present invention.

Please refer to FIG. 7. FIG. 7 is a flow chart of a method for integrating the integrated circuit layout structure according to the embodiment of the present invention. As shown in FIG. 7, the method of the integrated circuit layout structure includes steps of:

Step 1: Inputting a circuit diagram file, wherein the circuit diagram file includes a plurality of cells;

Step 2: Categorizing the plurality of cells into N categories by cell heights thereof, wherein the plurality of cells has at least two heights;

Step 3: Calculating an area of the cells for each of the N categories;

Step 4: Determining a row ratio of each of the N categories based on an area ratio of each area of the cells, and establishing N cell rows according to the row ratio.

Step 5: Placing each of the cells into the corresponding cell row according to the cell height thereof;

Step 6: Proceeding APR net routing; and

Step 7: Outputting a data in a GDS format from an APR tool.

More detailed description for the steps of the method for integrating the integrated circuit layout structure is provided as follows. For example, in step 1, the circuit diagram file is named as Circuit Design Netlist In. In step 2, an integrated circuit includes a cell INV, a cell NOR, a cell AND, a cell DFF, and a cell Latch. In step 3, the cell INV, the cell NOR, and the cell AND are simpler and belong to combinational logic and, the cell INV, the cell NOR, and the cell AND can be categorized into a cell row with L_ROW. The cell DFF and cell Latch are more complicated and belong to sequential logic, the cell DFF and cell Latch can be categorized into a cell row with H_ROW. In step 4, an area of the cells for the L_ROW and the H_ROW is calculated, respectively. A row ratio of a row number of the L_ROW to a row number of the H_ROW is determined by an area ratio of the area of the cells for the L_ROW to the area of the cells for the H_ROW. The L_ROW and the H_ROW are established based on the row ratio. Furthermore, a sum of the area of the L_ROW and the H_ROW satisfy a sum of the area of the cells for the L_ROW and the H_ROW, respectively. In step 5, the cells are placed into the corresponding cell row according to the cell height thereof. In step 6 and step 7, the APR net routing proceeds and the data in the GDS format is output from the APR tool.

In Step 3, the area of the cells for each of the cell rows can be calculated manually or by a program. For example, when it is desired to be calculated manually, the area of the cells for each of the cell rows follows the formula below: a sum of area=(the number of cells A in the integrated circuit)*(an area of the cell A)+(the number of cells B in the integrated circuit)*(an area of the cell B)+(the number of cells C in the integrated circuit)* (an area of the cell C).

However, when it is desired to be calculated by a program, the program calculates the area of each of the cells in a library of the APR tool. Then the program sums the area of each of the cells automatically and informs how much area is required and how much area of the cell row provides. If the area of the cell row is not enough, the next step (Step 4) cannot proceed. In Step 4, the step of establishing N cell rows is to establish the cell rows for accommodating the cells, such that the whole integrated circuit is electrically connected. This step is executed by the APR tool in the method of the conventional integrated circuit structure. All of cells have the same height. A sum of an area of the cells in a circuit diagram file is calculated by the APR tool. Then a cell row is established based on the same height to satisfy the sum of the area of the cells. Since an area of the single cell row cannot satisfy the sum of the area of the cells, there should be tens to hundreds of cell rows arranged by the APR tool.

When the APR tool is used for establishing the cell rows, the cells in one single cell row have the same height. When it is desired to establish cell rows with different heights, it is required to establish one cell row for each cell height manually or by a program according the different cell heights. However, the area of the cell row established manually or by a program is not enough for the sum of the area of the cells. How much area the H_ROW and the L_ROW provide, and how much area is required for the cells with the cell height H and the cell with the cell height L are known by calculating with the APR tool. The area of the H_ROW and the L_ROW should satisfy the area required by the cells with the cell height H and the cell with the cell height L. Otherwise, the APR tools cannot conduct the next step. Therefore, the cell rows are arranged repeatedly based on the area ratio of the area of the cells with the cell height H to the area of the cells with the cell height L until the area of the cell rows with the cell height H and the cell height L satisfies the sum of the area of the cells with the cell height H and the cell height L, respectively. For example, two cell rows can be input in the APR tool, and a warning of lack of area is sent by the APR tool. Information of the area required by the cells with different heights can be known through the warning. Then, the cell rows can be arranged according to the information by inputting a picture or a text in the APR tool. The text defines a coordinate of the cell rows. The text can be used for the same type of the integrated circuit and the cell rows can be reduced for saving area if the cell rows are too many in this case.

In Step 5, since all the cells in the conventional integrated circuit layout structure are in one identical height, the cells are arranged and placed to their locations according to a related connection therebetween. In other words, the cells with the related connection can be placed in the one cell row together. Additionally, the method of present invention is to place the cells with the cell height H in the H_ROW and to place the cells with the cell height L in the L_ROW.

An area required by a cell with sequential logic is usually bigger than an area required by a cell with combinational logic. Therefore, the cell with sequential logic is placed in the H_ROW and the cell with combinational logic is placed in the L_ROW. An area ratio of an area of the cell with sequential logic to an area of the cell of the cell with combinational logic is a row number of the H_ROW to a row number of the L_ROW. Furthermore, a cell which is more complicated does not just include sequential logic and combinational logic and is too large for the L_ROW should be put in the H_ROW.

In contrast to the prior art, the present invention provides an integrated circuit layout structure and a method thereof capable of fully utilizing a layout area of an integrated circuit and reducing unnecessary waste of the layout area of the integrated circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An integrated circuit layout structure, comprising:
  a first cell row comprising a first cell with a first cell height; and
  a second cell row comprising a second cell with a second cell height;
  wherein the first cell row and the second cell row are adjacent to each other and arranged in different rows in an integrated circuit, and a row ratio of a row number of the first cell row to a row number of the second cell row is determined by an area ratio of an area of the first cell with the first cell height to an area of the second cell with the second cell height in the integrated circuit.

2. An integrated circuit layout structure, comprising:
  a first cell row comprising a first cell with a first cell height;
  a second cell row comprising a second cell with a second cell height; and
  a third cell row comprising a third cell with a second third height;
  wherein the first cell row is adjacent to the second cell row, and the second cell row is adjacent to the third cell row, the first cell row, the second cell row, and the third cell row are arranged in different rows in an integrated circuit, and a row ratio of a row number of the first cell row to a row number of the second cell row to a row number of the third cell row is determined by an area ratio of an area of the first cell with the first cell height to an area of the second cell with the second cell height to an area of the third cell with the third cell height in the integrated circuit.

* * * * *